United States Patent
Kanbe et al.

(10) Patent No.: US 6,878,312 B1
(45) Date of Patent: Apr. 12, 2005

(54) COMPOSITION, FILM MANUFACTURING METHOD, AS WELL AS FUNCTIONAL DEVICE AND MANUFACTURING METHOD THEREFORE

(75) Inventors: Sadao Kanbe, Suwa (JP); Shunichi Seki, Suwa (JP)

(73) Assignees: Seiko Epson Corporation, Tokyo (JP); Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 09/701,468
(22) PCT Filed: Mar. 29, 2000
(86) PCT No.: PCT/JP00/01962
§ 371 (c)(1), (2), (4) Date: Nov. 29, 2000
(87) PCT Pub. No.: WO00/59267
PCT Pub. Date: Oct. 5, 2000

(30) Foreign Application Priority Data

Mar. 29, 1999 (JP) .......................... 11-086944
Sep. 3, 1999 (JP) .......................... 11-250486

(51) Int. Cl.$^7$ .............................................. C09K 11/06
(52) U.S. Cl. ............. 252/583; 252/301.16; 252/301.35
(58) Field of Search ................................ 252/582, 583, 252/301.16, 301.35

(56) References Cited

U.S. PATENT DOCUMENTS

| | | | | |
|---|---|---|---|---|
| 4,855,120 A | * | 8/1989 | Marlett ........................ 252/582 |
| 5,006,370 A | * | 4/1991 | Eisenbraun et al. ........ 252/582 |
| 5,068,131 A | * | 11/1991 | Eisenbraun et al. ........ 252/582 |
| 5,484,689 A | * | 1/1996 | Takano et al. .............. 252/582 |
| 6,207,301 B1 | * | 3/2001 | Ohnishi et al. ............. 428/690 |
| 6,403,236 B1 | * | 6/2002 | Ohnishi et al. ........ 252/301.35 |
| 2002/0186287 A1 | * | 12/2002 | Kawase ...................... 347/100 |

FOREIGN PATENT DOCUMENTS

| JP | 59-71372 | * | 4/1984 |
|---|---|---|---|
| JP | 64-16880 | * | 1/1989 |
| JP | 4-153280 | * | 5/1992 |

* cited by examiner

Primary Examiner—Philip C. Tucker
(74) Attorney, Agent, or Firm—Oliff & Berridge, PLC

(57) ABSTRACT

A composition, which can be used in an ink jet printing method, can use either a non-polar or a weakly polar material as a functional material, prevents clogging at dispensing time, achieves stable dispensing, and prevents precipitation of content matter during dispensing and phase separation during film formation, a uniform, homogenous functional film formed using this composition and a manufacturing method therefor, as well as an organic EL device or other such display device and a manufacturing method therefor. A composition of the present invention consists of a functional material, and a solvent comprising at least one benzene derivative, which has one or more substituents, and these substituents have 3 or more carbon atoms in total. A functional film of the present invention is formed using the above-mentioned composition. A display device of the present invention comprises luminescent material layers formed using the above-mentioned composition between two electrodes. The above-mentioned display device is an organic EL device or the like.

11 Claims, 3 Drawing Sheets

(A)

(B)

(C)

(D)

(E)

(F)

(G)

(H)

COMPOSITION, FILM MANUFACTURING METHOD, AS WELL AS FUNCTIONAL DEVICE AND MANUFACTURING METHOD THEREFORE This application is a 371 of PCT/JP00/01962 filled on Mar. 29, 2000.

TECHNICAL FIELD

The present invention relates to a composition (dispensing composition), which is used to form a functional material patterned film, and can be stably dispensed using a dispensing apparatus, a film manufacturing method, which forms a uniform film (functional film) using this composition, as well as a functional device comprising luminescent material layers formed using the above-mentioned composition, and particularly a functional device (display device), such as an organic electroluminescent (EL) device, which is useful in luminescent display applications, and a manufacturing method therefor.

BACKGROUND ART

In the past, functional material patterning has been done using photolithography techniques. Because this method has drawbacks, such as high costs and complicated processes, recently, functional material patterning using a dispensing apparatus, which is convenient, and makes cost cutting possible, has been under study. A method, which uses an ink jet printing apparatus, has been studied in particular.

For example, the manufacture of color filters for use with liquid crystal displays can be raised as an example of micro-patterning using an ink jet printing apparatus. This is a manufacturing method, which appropriately ejects either dyed or pigmented ink of red, blue, and green in accordance with a printing apparatus having nozzles, which eject ink of three colors, red, blue and green, producing a color filter. The ink used in this manufacturing method is ordinarily water-soluble polar ink. In most cases, water-soluble ink such as this contains glycerin or some other solvent to prevent nozzle clog when the ink dries.

Further, a method for making a luminescent material such as an organic fluorescent material, for example, into an ink, supplying this ink via dispensing onto a substrate using an ink jet method, and patterning the luminescent material is being used, and a color display device, and more particularly, an organic EL display device, which uses an organic luminescent material as a luminescent material, of a construction, in which a layer of this luminescent material is interposed between the positive and negative electrodes, is being developed.

The manufacture of this color display device (organic EL display device) is, for example, carried out as follows.

Firstly, a fluorescent material is dissolved in a suitable solvent, and made into ink. This ink (composition) is dispensed or ejected onto a transparent electrode-equipped substrate, which serves as the positive electrode of an organic EL display device, so as to cover these transparent electrodes. At this point, an electrode is either formed on a single plane, or has a strip- or mosaic-shaped pattern, and is a structure, which is connected to, and can be driven by a power source. Next, after forming a luminescent material layer by drying and removing the solvent in the ink, a small, work function metal, for example, a silver, lithium, calcium, aluminum or other metal is expediently deposited on this luminescent material layer using a vapor deposition or sputtering method, forming a negative electrode. In this fashion, a display device of a structure in which this luminescent material layer is interposed between a positive and a negative electrode is achieved.

A pattern forming method using a conventional ink jet printing technique such as this has extremely outstanding characteristics, such as saving labor, saving resources, and not requiring mask making, but it also has the drawback of limiting the materials used in the composition (dispensing composition).

In the ink jet method, a solvent such as, for example, ethanol or water is used as the solvent in the dispensing composition. However, among non-polar, or weakly polar functional materials, or polymer functional materials (luminescent materials or the like), there are those that do not dissolve in these solvents. There is also the drawback that functional materials, which either react with water and alcohol, or are decomposed by alcohol, cannot be used.

Further, in a case in which benzene, toluene, xylene or another solvent that readily dissolves a non-polar material is used as the solvent for dissolving a functional material, due to the low boiling point (high vapor pressure) of such a solvent, the drawback is that it dries easily, and is apt to cause nozzle clog. Further, either during dispensing or after dispensing, there are times in the formation of a film, when the dispensing composition is robbed of its heat of vaporization by the volatilization of the solvent, and the temperature of the dispensing composition drops, promoting the precipitation of the functional material. In addition thereto, in the case of a functional material having multiple constituents, the drawback is that phase separation occurs, the film becomes non-uniform, and the functional film is no longer able to carry out its original role.

Furthermore, in a case in which a material, which cannot be easily used, and has poor solubility like this, is used anyway, and the concentration of the dispensing composition is increased, precipitation and clogging occur. When the concentration is made weaker in an attempt to prevent clogging, the drawback is that dispensing must be performed numerous times to achieve the characteristics of the functional material, and the number of processes must be increased.

An object of the present invention is to provide a composition, which can be used in an ink jet printing method instead of a photolithography method, which is the conventional method for patterning a functional material, and can utilize a material that is either non-polar or weakly polar, or a material of a reactivity that reacts easily with water.

Further, another object of the present invention is to provide a composition, which prevents clogging at dispensing, achieves stable dispensing, and prevents precipitation of content matter during dispensing and also prevents phase separation during post-dispensing film formation. Furthermore, another object of the present invention is to provide a uniform film (functional film) manufacturing method, and a functional device (display device) such as an organic EL device, and a manufacturing method therefor.

DISCLOSURE OF THE INVENTION

The present invention achieves the above-mentioned objects by providing a composition, which is characterized in that it consists of a functional material, and a solvent comprising at least one benzene derivative having one or more substituents, and these substituents having 3 or more carbon atoms in total.

Further, the present invention provides a film manufacturing method, which is characterized in that a film is formed using the above-mentioned composition. Further, the present invention provides a functional device comprising a luminescent material layer formed between a first and a second electrode using the above-mentioned composition, and a manufacturing method therefor.

Figure 1:
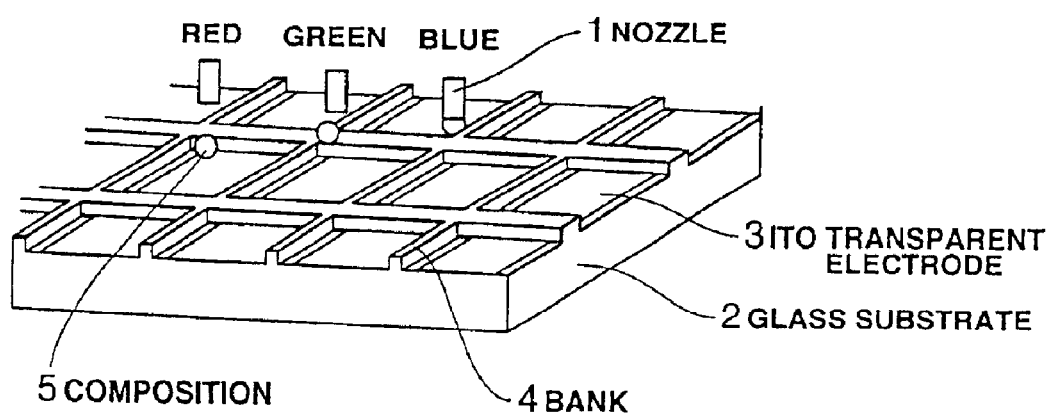
FIG. 1 is an oblique view schematically showing a manufacturing process of a functional thin film and an organic EL device as a functional device using a composition of the present invention.

BEST MODE FOR carrying OUT THE INVENTION

Hereinbelow, a composition, film manufacturing method, as well as a functional device and a manufacturing method therefor of the present invention will be explained in detail.

A composition of the present invention is characterized in that it consists of a functional material and a solvent comprising at least one benzene derivative, which has one or more substituents, and these substituents have 3 or more carbon atoms in total.

Furthermore, what is referred to here as "these substituents have 3 or more carbon atoms in total" means that the total number (sum) of carbon atoms of all the displacable substituents in a benzene derivative is 3 or more. Therefore, for example, even when one substituent is a methyl group or an ethyl group having 1 or 2 carbon atoms, if combining this with another substituent constitutes 3 or more carbon atoms, then this combination can be incorporated in the above-mentioned benzene derivative related to the present invention.

The above-mentioned benzene derivative utilized in the composition of the present invention has one or more substituents as explained hereinabove. As one of these substituents, there are no particular limitations as long as the total number of carbon atoms of all the substituents constitutes 3 or more. As examples, either a normal chain or branched aliphatic hydrocarbon group, alicyclic hydrocarbon group, or aromatic hydrocarbon group can be given, and furthermore, oxygen atoms, nitrogen atoms, sulfur atoms and other hetero atoms can be contained in these hydrocarbon groups. Further, the respective substituents can also bond together to form a cycloalkane ring or other ring structure.

Further, as for the above-mentioned benzene derivative, the number of carbon atoms thereof is 3 or more as mentioned above, but from the standpoint of being able to further improve the solubility of a non-polar or weakly polar functional material, this number is preferably between 3 and 12, and more preferably, between 3 and 6.

The above-mentioned benzene derivative is used in a composition of the present invention as a solvent, which at least comprises this benzene derivative. As such a solvent, either a single solvent consisting of the 1 benzene derivative given as an example hereinabove, or a mixed solvent consisting of two or more these benzene derivatives will be acceptable, and a mixture of the above-mentioned benzene derivative and a solvent other than the above-mentioned benzene derivative will also be acceptable.

Here, as solvents other than the above-mentioned benzene derivative, in addition to a benzene derivative having 1 or more substituents of xylene, toluene or the like, with the total number of carbon atoms of these substituents being 2 or less (under 3), or a non-displacable benzene compound, a displacable benzene compound with a substituent that does not comprise carbon atoms can be given as an example.

As a functional material used in a composition of the present invention, there are no particular limitations, and even if it is a non-polar or weakly polar material, or a material of a reactivity that readily reacts with water, it can be utilized. As such a functional material, a material, which accords with the application of a composition of the present invention, is utilized, and an organic EL material or other luminescent material, a silica glass precursor, a color filter material, an organic metal compound or other conductive material, and either a dielectric or semiconductor material can be given as examples. An organic EL material, silica glass precursor, and color filter material are especially favorable.

A composition of the present invention will be utilized in a variety of applications, but ideally it will be used in ink jet methods in particular.

If a composition that requires the above-mentioned benzene derivative of the present invention is used, soluble material selectivity in particular will become broader, drying will be prevented at least during dispensing, stable dispensing will be made possible, and a uniform, homogenous, micro film (functional film) will be achieved. To produce this excellent film, the above-mentioned composition of the present invention is supplied via dispensing and distributed on a substrate, and thereafter, this film is produced by subjecting this substrate to heat treatment (heating). Specifically, there can be cited a method, by which, after a composition of the present invention has been dispensed and distributed on a substrate by a dispensing apparatus, the substrate is treated at a temperature that is higher than the temperature at dispensing. In general, the dispensing temperature is room temperature, and the substrate is heated after dispensing. By carrying out this kind of treatment, the content matter, which precipitated due to a drop in temperature resulting from post-dispensing solvent volatilization, is re-dissolved, and a uniform, homogenous film can be obtained without phase separation.

As for the temperature of the heat treatment, little effect is noticed in the vicinity of room temperature, but effects become evident at 40° Centigrade and higher. When the temperature exceeds 200° C., the solvent evaporates as soon as heat is applied, and the effect of heating is lost. Based on the above, the ideal heat treatment temperature is between 40° and 200° C. More preferably, by heating at 50–200° C., a more uniform, homogenous functional film can be obtained. The following effects are obtained by such a heat treatment temperature setting. In the case of dispensing or ejecting a composition (ink) via an ink jet method in particular, generally, the solvent is vaporized, the temperature of the ink droplets is lowered, and content matter precipitation is a possibility. When the content matter of the ink constitutes 2 constituents or more, there are cases in which the ink changes from a homogenous mixture system to a non-homogenous mixture system. In this case, phase separation occurs inside the luminescent material, and the chromaticity and luminous efficiency achieved via a homogenous system is not obtained. Accordingly, performing heat treatment by applying heat in the above-mentioned temperature range has the effect of re-dissolving the content matter of the dispensed composition, and making it more homogenous.

Further, when manufacturing a film, not only heat treatment (heating), but also reduced pressure, pressurization, or a combination of these with heating can be used as needed.

For example, as a reduced pressure and heating combination, after heat treatment, it is desirable that pressure be reduced as-is immediately, thus removing the solvent. As for the pressure when reducing pressure, from the standpoint of being able to achieve a more uniform, homogenous functional film, preferably this pressure is $20 \times 10^{-3}$ mmHg (Torr) or less. By so doing, it is possible to prevent phase separation of the content matter when concentrating a composition. That is, when a once re-dissolved content matter is concentrated, solvent is suddenly eliminated, and by uniformly affixing the content matter before same becomes non-homogenous, the non-homogenization(phase separation) of the content matter is prevented, and the desired luminescent intensity and chromaticity initially targeted can be achieved in the formed luminescent material layer.

Further, the time from the start of heat treatment until the point in time when pressure reduction commences is established in accordance with the dispensing volume and material characteristics.

As a dispensing apparatus, which uses a composition of the present invention in an ink jet method, and which is used in the production of the above-mentioned film (functional film), an ink jet printing apparatus, and a dispenser can be cited, the ink jet printing apparatus being preferable.

Further, if a composition of the present invention is used, an outstanding functional device, such as an organic EL device, which is particularly useful in luminescent display applications, can be achieved. Specifically, a display device comprising a luminescent material layer (emitting material layer) formed between a first and second electrode using the above-mentioned composition of the present invention (preferably, a hole injection/transport layer will also be established between the above-mentioned first electrode and the above-mentioned luminescent material layer) is achieved.

Here, hole injection/transport layer refers to a layer having a function for injecting an electron hole or other hole inside, and, in addition, having a function for transporting an electron hole or other hole on the inside. Providing this kind of hole injection/transport layer is desirable for improving the luminous efficiency, life and other device characteristics of an organic EL device in particular.

Furthermore, as a functional device, in addition to a thin, lightweight, low power consumption, high angle of visibility multicolor display device, which uses an organic luminescent material, for example, an organic EL device, there can be cited a display, which has a plurality of pixels, and in which a thin film transistor or other switching device is provided for each pixel.

In manufacturing a display device as this outstanding functional device, manufacture is carried out by selectively supplying the above-mentioned composition of the present invention onto a substrate having a first electrode, and preferably, forming a luminescent material layer pattern by either heating, reducing pressure, or pressurizing, or by combining these with heating, and next, forming a second electrode on this luminescent material layer pattern (Preferably, after forming via an ink jet method using a solution comprising a polar solvent a hole injection/transport layer on the above-mentioned substrate, which has a first electrode, more preferably, the above-mentioned luminescent material layer pattern is formed on this hole injection/transport layer using a solution, which utilizes a non-polar solvent.). In this manner, it is possible to achieve an outstanding organic EL device.

It is preferable that the luminescent material layer as functional film, which utilizes a composition of the present invention in the above-mentioned functional device, be formed in accordance with the manufacturing method of the above-mentioned film (functional film).

Further, as the solution (composition) comprising a polar solvent, which is utilized when forming a hole injection/transport layer, there can be cited polythiophene derivatives, such as polyethylene dioxythiophene, and solutions, which mix constituents, such as polystyrene sulfonic acid, into polar solvents, such as α-butyrolactone, N-methylpyrolidone, 1,3-dimethyl-2-imidazolidinone and derivatives thereof, carbitol acetate, butyl carbitol acetate and other glycol ethers. Using a polar solvent such as this is desirable for enabling stable dispensing without nozzle clog, and for excellent film formability.

Hereinbelow, compositions of the present invention will be explained in detail based on the preferred embodiments therefor.

(First Embodiment)

A first embodiment of a composition of the present invention is a composition, which is utilized in functional material pattern film formation using a dispensing apparatus, and is a composition comprising a functional material and a solvent comprising at least one benzene derivative, which has 1 or more substituents, and these substituents have 3 or more carbon atoms in total.

According to this embodiment, the effects are that a non-polar or weakly polar functional material can be readily dissolved, and functional material selectivity can be broadened, and, in addition, especially in a case in which a solvent with a relatively low vapor pressure is used, from the standpoint of delayed drying capabilities, clogging is prevented at solvent dispensing time, and stable dispensing is made possible, and it is possible to achieve the prevention of content matter precipitation and phase separation during post-dispensing film formation in accordance with either subsequent heating, or by combining heating with a treatment, such as pressurizing, or heating followed immediately by reducing pressure.

As a solvent, which is compatible with the first embodiment, and which comprises at least one benzene derivative having 1 or more substituents, with these substituents having 3 or more carbon atoms in total, there can be considered either single solvents, such as cumene, cymene, cyclohexylbenzene, dodecylbenzene, diethylbenzene, pentylbenzene, dipentylbenzene, butylbenzene, tetralin, and tetramethylbenzene, or mixtures of these solvents. Or xylene, toluene, benzene and the like can be added to these single solvents, or mixed solvents as required by circumstances. By utilizing single solvents or mixed solvents like those given as examples here, a composition in which there is dissolved a non-polar or a weakly polar functional material becomes a possibility. That is, material selectivity broadens. Further, utilizing a single solvent or a mixed solvent like this enables the prevention of clogging.

It is preferable that the boiling point of the benzene derivative utilized in a composition of the first embodiment by 200° C. or higher. Solvents such as this include dodecylbenzene, cyclohexylbenzene, tetralin, dipentylbenzene, and pentylbenzene. Utilizing these solvents is even more favorable as it enables the further prevention of solvent volatilization.

It is preferable that dodecylbenzene be the benzene derivative utilized in a composition of the first embodiment. As a dodecylbenzene, a single n-dodecylbenzene is fine, and a mixture of isomers is also fine.

This solvent has characteristics such as a boiling point of over 300° C., and viscosity of 6 mPa·s or more (20° C.), and this solvent alone is of course fine, but adding it to another solvent is good for preventing a composition from drying. Further, of the solvents mentioned above, since the viscosity of those other than dodecylbenzene is relatively small, dodecylbenzene is extremely good because adding this solvent to the others enables viscosity adjustment.

As a functional material, which is compatible with the first embodiment, an organic EL material can be considered. In particular, it is desirable that the organic EL material comprise a material that is either non-polar, or weakly polar. For example, an EL material comprising a derivative of a (poly)paraphenylene vinylene system, polyphenylene system, polyfluorene system, or polyvinyl carbazole system, a low molecular weight organic EL material capable of being dissolved in another benzene derivative, and a high molecular weight EL material can be considered. For example, it will also be possible to use rubrene, perylene, 9, 10-diphenyl anthracene, tetraphenyl butadiene, nile red, coumarin6, quinacridone, and a polythiophene derivative. Further, these materials can also be used for electron transportable and hole transportable materials, which are peripheral materials of an organic EL display.

Further, as a functional material compatible with the first embodiment, in addition to the above-mentioned organic EL material, polysilazane (made by Tonen, for example), which is the silicon glass precursor substance of an interlayer insulation layer that has numerous uses in a semiconductor, and an organic silicon-on-glass (SOG) material can also be considered.

Furthermore, it is also desirable that the functional material for forming a composition of the first embodiment be a material for a color filter. As this color filter material, various kinds of sublimation dyes can be selected, such as, for example, sumika red B (brand name of a dye manufactured by Sumitomo Chemical Co., Ltd.), kayaron fast yellow-GL (brand name of dye manufactured by Nihon Kayaku Co., Ltd.), and daiaserin fast brilliant blue-B (brand name of dye manufactured by Mitsubishi Kasei Corporation).

And furthermore, organic metal compounds can also be used as functional materials. Or, if it is a material that will dissolve in the above-mentioned solvents, then any kind of functional material can be used as a composition.

By using a composition of the first embodiment, it is possible to prepare a functional film, such as a functional material patterned film, using a dispensing apparatus. The preparation method for this functional film can be performed in accordance with the above-mentioned film manufacturing method. That is, a functional film can be obtained by supplying via dispensing and distributing a composition of the first embodiment on a substrate, and thereafter, subjecting this substrate to heat treatment preferably at 40° C.–200° C. In the first embodiment in particular, setting this heat treatment temperature to 50° C.–200° C. is even more preferable for enabling the realization of a more uniform, homogenous functional film. Further, in the first embodiment, it is desirable to apply heat while applying pressure during high temperature treatment. By so doing, it is possible to delay the volatilization of the solvent at heating, making the re-dissolving of the content matter even more complete. As a result thereof, it is possible to obtain a more uniform, homogenous functional film. From the standpoint of producing an even more uniform, homogenous functional film, preferably the pressure applied is 1520–76000 mmHg (2–100 atmospheres).

Further, in the heat treatment of a composition of the first embodiment, it is desirable to remove the solvent by reducing pressure as mentioned above prior to the composition becoming completely dry.

As a dispensing apparatus capable of using a composition of the first embodiment, an ink jet printing apparatus, dispenser or the like can be utilized, but an ink jet printing apparatus is desirable due to the fineness and precision thereof, and by utilizing this ink jet printing apparatus, it is possible to manufacture a micro functional film easily and at low cost.

By using a composition of the first embodiment, it is possible to obtain, in a preferable manner, an organic EL device or other such display device, which is useful as the above-mentioned functional device (preferably, a display device having a hole injection/transport layer provided between the above-mentioned first electrode and above-mentioned luminescent material layer.).

(Second Embodiment)

A second embodiment of a composition of the present invention is a composition containing a solvent comprising at least dodecylbenzene, and a polyfluorene derivative of at least 1 of the compounds 1 through 5 hereinbelow. That is, the second embodiment is a composition, which utilizes a solvent, which is compatible with the second embodiment in a composition of the present invention, and which comprises at least dodecylbenzene as a solvent comprising a benzene derivative having 1 or more substituents, and these substituents have 3 or more carbon atoms in total, and which utilizes a polyfluorene derivative of at least 1 of the compounds 1 through 5 as a functional material that is compatible with the second embodiment.

This embodiment is a more preferred aspect than the first embodiment explained hereinabove, and from the standpoint of using the low vapor pressure solvent dodecylbenzene, and having delayed drying capabilities, can prevent clogging at solvent dispensing, and can ensure stable dispensing, and in particular, preferably has the effect of making it possible to achieve a uniform film without phase separation by either applying heat and pressure, or reducing pressure immediately after heating, which will be explained hereinbelow.

Because this embodiment, as mentioned hereinabove, is a more preferred version of the first embodiment, with regard to points that are not explained in particular detail in the description for the second embodiment, the detailed description regarding the above-mentioned first embodiment will be applied as the occasion demands.

COMPOUND 1

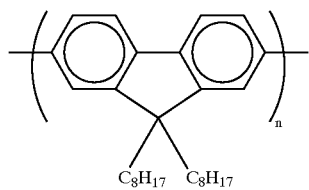

COMPOUND 2

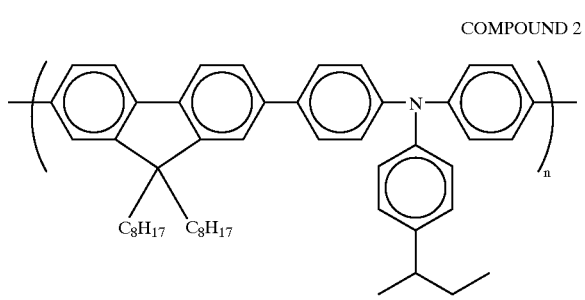

COMPOUND 3

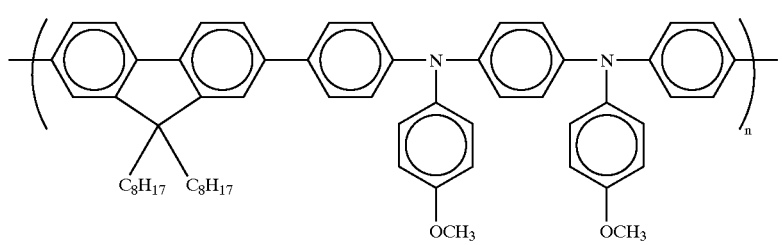

COMPOUND 4

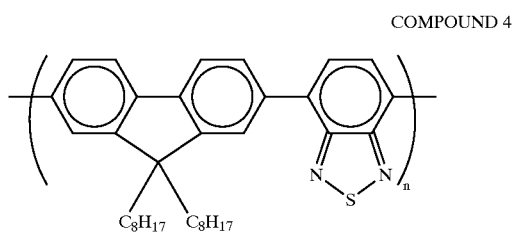

COMPOUND 5

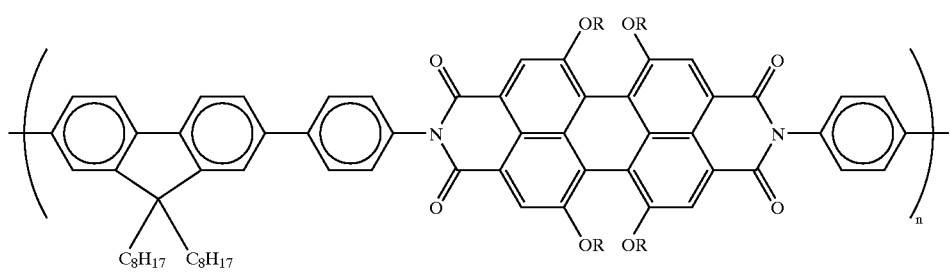

The second embodiment will be explained in detail. A composition of this embodiment, by using dodecylbenzene as the solvent thereof, makes it possible to prevent excessive drying when dispensing from an ink jet head, and in particular, enables the prevention of clogging in an ink jet head because the delayed drying effect of this dodecylbenzene is manifested in a case in which this composition is utilized as an ink composition when forming a pattern using an ink jet method. Further, even after dispensing, the dispensed material remains in liquid form on the material targeted for dispensing, making possible post-treatment, such as heating. Furthermore, the above-mentioned special structure polyfluorene derivatives (compounds 1 through 5) are prepared as luminescent materials, have strong luminous intensity, and due to their being weakly polar, have good solubility for dodecylbenzene, and according to combining this luminescent material with a solvent, are capable of good patterning as a component member of an organic EL display device in particular.

In a composition of the second embodiment, a variety of second solvents capable of dissolving a luminescent material in dodecylbenzene can be mixed with the composition and utilized as a solvent. Preferably, a solvent with a boiling point of 140° C. or higher is mixed in and utilized. AS such a second solvent with a boiling point of 140° C., cymene, tetralin, cumene, decalin, durene, cyclohexylbenzene, dihexylbenzene, tetramethylbenzene, dibutylbenzene and the like can be utilized. It is especially desirable to utilize a solvent having a compound, which has substituents of 3 or more carbon atoms in a benzene ring. Further, it is preferable to utilize a solvent with a boiling point of 180° C. or higher, such as tetralin, 1,2,3,4-tetramethylbenzene, 1,2,3,5-tetramethylbenzene, cyclohexylbenzene, decalin, and dibutylbenzene. By adding these solvents, it is possible to adjust the concentration and drying rate of an ink composition. It also has the effect of reducing the high viscosity of dodecylbenzene. Furthermore, a composition that utilizes tetralin as a solvent having the above-mentioned 180° C. or higher boiling point has the advantage of making it possible to increase the concentration thereof. In addition, toluene, xylene, chloroform, and carbon tetrachloride can be utilized as a solvent.

As a luminescent material that serves as a functional material in conformance with the second embodiment, in addition to the above-mentioned specific polyfluorene derivative, a (poly)paraphenylene vinylene derivative, polyphenylene derivative, polyvinyl carbazole derivative, polythiophene derivative, perylene system pigment, coumarin system pigment, rhodamine system pigment, and non-polar or weakly polar materials are suitable, but in addition, a low molecular weight organic EL material and a polymer organic EL material, which are capable of dissolving in a benzene derivative, can also be used. For example, it will also be possible to use rubrene, perylene, 9,10-diphenyl anthracene, tetraphenyl butadiene, nile red, coumarin6, quinacridone, and the like. Further, it is also possible to make appropriate use of a hole transport material and an electron transport material, which constitute an organic EL display device.

Further, as the above-mentioned luminescent material, a compound (6) having the below structure can also be added.

COMPOUND 6

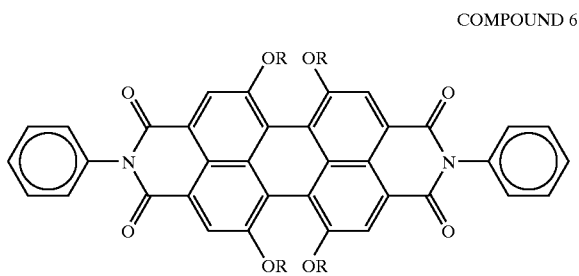

By using a composition of the second embodiment, ideally it is possible to obtain an organic EL device or other such display device, which is useful as the above-mentioned functional device (preferably, a display device comprised by providing a hole injection/transport layer between the above-mentioned first electrode and above-mentioned luminescent material layer.) just like with the above-mentioned first embodiment.

When preparing the above-mentioned luminescent material layer using a composition of the second embodiment, for example, this composition is dispensed and distributed on a substrate by a dispensing apparatus as described hereinabove, and thereafter, the substrate is subjected to heat treatment at a temperature that is higher than the temperature at dispensing (preferably, between 40°–200°). The heat treatment process is better the higher the temperature at which it is performed, but in a case in which a low boiling point solvent is utilized, there is the danger that drying will be completed immediately following dispensing and the advantages of this process will not be fully realized. According to this example, because dodecylbenzene, a high boiling point solvent, is utilized, the content matter of a dispensed composition is re-dissolved by the heat treatment, making the above-mentioned effect of greater uniformity superb.

It is preferable that the above-mentioned heat treatment of the composition be carried out at the same temperature as in the case of the above-mentioned first embodiment. Further, it is desirable that the above-mentioned heat treatment of the composition be carried out under applied pressure the same as the above-mentioned first embodiment, and furthermore, it is desirable that in the above-mentioned heat treatment of the composition the solvent be removed by reducing pressure prior to the composition drying completely.

(Third Embodiment)

A third embodiment of a composition of the present invention is a composition consisting of a functional material and a solvent comprising at least 1 benzene derivative, which has 1 or more substituents, and these substituents have 3 or more carbon atoms in total, and which has a vapor pressure (at room temperature; the same hereinbelow) of between 0.10 and 10 mmHg. That is, the third embodiment is a composition, which utilizes a solvent, which is compatible with the third embodiment in a composition of the present invention, and which comprises at least one benzene derivative with a vapor pressure of between 0.10 and 10 mmHg as a solvent comprising at least one benzene derivative having 1 or more substituents, with these substituents having 3 or more carbon atoms in total.

According to this embodiment, the effects are obtained that a non-polar or weakly polar functional material can be readily dissolved, and, in addition, clogging is prevented at solvent dispensing time, and stable dispensing is made possible, and it is possible to achieve the prevention of content matter precipitation at dispensing and phase separation during post-dispensing film formation. In particular, if using a solvent of a vapor pressure of the above-mentioned scope, there are achieved characteristics whereby drying is difficult to a certain degree, thus achieving a balance such that the material dries rapidly enough so that phase separation does not occur, and a film is formed without phase separation via natural drying at room temperature.

As a solvent, which is utilized in a composition of the third embodiment, and which comprises at least 1 benzene derivative of the above-mentioned vapor pressure of between 0.10 and 10 mmHg, there can be cited 1,2,3,4-tetramethylbenzene, 1,2,3,5-tetramethylbenzene, cyclohexylbenzene, pentylbenzene, mesitylene, cumene, cymene, diethylbenzene, tetralin, and decalin, and of these, 1,2,3,4-tetramethylbenzene is especially preferable.

Further, as the above-mentioned benzene derivative, a mixture of at least 1 benzene derivative of a 0.10–0.50 mmHg vapor pressure, and at least 1 benzene derivative of a 0.50–10 mmHg vapor pressure is also preferable.

Here, as the above-mentioned benzene derivative of a 0.10–0.50 mmHg vapor pressure, either tetramethylbenzene or cyclohexylbenzene is preferable.

Further, as the above-mentioned benzene derivative of a 0.50–10 mmHg vapor pressure, diethylbenzene and/or mesitylene is preferable.

There are no particular limitations as to a functional material, which is compatible with a composition of the third embodiment, and, for example, the above-mentioned organic EL material, and silicon glass precursor material can be applied to this embodiment, and, in particular, at least 1 polyfluorene derivative, especially the above-mentioned compounds 1–5, which are utilized in a composition of the second embodiment described hereinabove, is ideal. Therefore, as a functional material utilized in this embodiment, a luminescent material that serves as a functional material, which was described in the above-mentioned second embodiment, is applied according to circumstances.

Further, a composition of the third embodiment can achieve a specific outstanding device by removing residual solvent after film formation via either heating, or a combination of heating and pressure reduction. It is preferable that the heating temperature at this time be 40° C.–200° C., and more preferably 50° C.–100° C. Further, it is desirable that the pressure at reduced pressure be $20 \times 10^{-3}$ mmHg or less. Further, after dispensing (after dispensing ink to the entire surface of a substrate), a film can be formed under either heating or a combination of heating and reduced pressure, even if droplets remain.

By using a composition of the third embodiment, the same as in the above-mentioned first and second embodiments, ideally it is possible to obtain an organic EL device or other such display device, which is useful as the above-mentioned functional device (preferably, a display device comprised by providing a hole injection/transport layer between the above-mentioned first electrode and above-mentioned luminescent material layer.)

The present invention will be explained more concretely hereinbelow by referring to the examples. However, the present invention is in no way limited to these examples.

EXAMPLES OF FIRST EMBODIMENT

Example 1-1

A tetrahydrofuran solution of a polyvinyl carbazole was applied to the electrode side of a glass substrate equipped with a transparent indium-tin-oxide (ITO) electrode, and a 0.1 micrometer polyvinyl carbazole film was formed via a spin coating method. On this film, a 0.1 percentage by weight xylene/tetralin mixed solution of polyhexyloxyphenylene vinylene (xylene/teralin=¼ percentage by volume) was dispensed in a prescribed shape using an ink jet printing apparatus. Furthermore, aluminum was deposited on top thereof.

Lead wires were derived from the ITO and aluminum, and with the ITO as the positive electrode and the aluminum as the negative electrode, an orange light was emitted in a prescribed shape upon the application of a voltage of 10 volts. In a case in which conventional ink, which used only xylene as a solvent, was dispensed, drying was rapid, clogging occurred, and the ink jet printing apparatus soon became unusable, whereas according to this method, clogging ceased to occur.

Example 1-2

A polysilazane solution of 20 weight percent of xylene (manufactured by the Tonen Chemical Corporation) was mixed together with a mixed solution of cymene and tetralin (cymene/tetralin=1/1) so as to constitute 20 percent by volume of a mixed solvent. The thus obtained polysilazane solution was dispensed via an ink jet printing apparatus so as to cover the entire surface of a plastic liquid crystal panel, and allowed to dry. This same process was performed on the opposite side, forming a polysilazane film on both sides of the panel. This panel was placed in an 85° C., 90 percent thermo-hygrostat for 20 minutes, forming a silica-glass film. After removing this panel, and allowing it to dry, 2 polarizing plates were laminated from both sides so as to be orthogonal.

In accordance with this method, much less polysilazane was used than with the spin coating method, making possible the formation of a silica-glass film with practically no loss. Further, the gas permeability of the liquid crystal panel was improved, and the life of the liquid crystal panel was also improved.

Example 1-3

A polysilazane solution of 20 weight percent of xylene (manufactured by the Tonen Chemical Corporation) was mixed together with a mixed solution of cymene and tetralin (cymene/tetralin=1/1) so as to constitute 20 percent by volume of a mixed solvent. The thus obtained polysilazane solution was dispensed via an ink jet printing apparatus, and applied to the entire surface of a silicon substrate, which had been furnished with semiconductor device formations and aluminum wiring. After application, the substrate was dried at 150° C. for 20 minutes, and thereafter, baked for 2 hours at 350° C. in a steam environment.

As a result thereof, a planarized film was obtained using silica glass of roughly the same properties as when a spin coating method is used. However, 2 orders of magnitude less polysilazane was used.

Example 1-4

An aspect of this example of the present invention will be explained in more detail. As shown in FIG. 1, the below-described dispensing compositions, in which have been dissolved organic EL materials that emit the colors red, green and blue, are ejected and distributed by an ink jet printing apparatus so as to be arrayed in a mosaic of each color on transparent ITO (indium-tin-oxide) electrodes partitioned into a mosaic, and an electrode of a glass substrate equipped with banks surrounding the transparent electrodes. The ratio of the solid relative to the solvent in all cases is 0.4% (weight/volume). In FIG. 1, 1 indicates a nozzle, 2 indicates a glass substrate, 3 indicates a transparent ITO electrode, 4 indicates a bank (partition), and 5 indicates a composition (ink droplet), respectively.

<Dispensing Composition>

Solvent: Dodecylbenzene/tetralin (1/1, volume percentage)

Red: Polyfluorene/perylene dye (98/2, percentage by weight)

Green: Polyfluorene/coumarin dye (98.5/1.5, percentage by weight)

Blue: Polyfluorene.

The substrate obtained by ejecting the composition was heated at 100° C. and the solvent was removed, and thereafter, an appropriate metal mask was placed on this substrate, and 2000 Angstroms of aluminum was deposited thereon.

Lead wires were derived from the ITO and aluminum, and with the ITO as the positive electrode and the aluminum as the negative electrode, red, green and blue colors were emitted in a prescribed shape upon the application of a voltage of 15 volts. In a case in which conventional ink, which used only xylene as a solvent, was dispensed, drying was rapid, clogging occurred, and the ink jet printing apparatus soon became unusable, whereas according to this method, clogging ceased to occur. Further, since the substrate was heated after dispensing the ink composition and the content matter re-dissolved, the separation of the content matter was prevented, and there were no problems whatsoever in the emission spectrum. A case in which xylene or some other low boiling point solvent was utilized was not preferable because drying commenced immediately after dispensing, content matter precipitated and phase separation occurred due to heat of vaporization, and changes occurred in the emission spectrum.

If each of the above-mentioned ITO electrodes were to be connected to a thin-film transistor (TFT) device, it would be possible to produce via organic EL a display that is the same as a liquid crystal display currently in circulation.

Example 1-5

After drying for 1 minute at 100° C. a substrate that had been subjected to ejecting the same as in Example 1-4, the solvent was removed by immediately reducing the pressure (2 mmHg). Utilizing the resulting substrate, a panel was produced by the same method as Example 1-4, and upon being lighted, the same results as in Example 1-4 were achieved.

Example 1-6

A substrate that had been subjected to dispensing the same as in Example 1-4 was set in a bell jar, the bell jar was filled with nitrogen gas and the internal pressure was set a 2 atmospheres, the substrate was dried at 100° C., and the solvent was removed. Utilizing the resulting substrate, a panel was produced by the same method as Example 1-4, and upon being lighted, the same results as in Example 1-4 were achieved.

EXAMPLES OF SECOND EMBODIMENT

Example 2-1

In this example, a color display device will be manufactured.

With regard to the processes in this example, these can be explained using FIG. 1 the same as the examples of the first embodiment described hereinabove. That is, in the structure shown in FIG. 1, a transparent ITO electrode 3 is formed in a dot-shaped pattern, each dot is directly connected to an independent TFT device (not shown in the figure), forms a pixel, and can be driven. A bank 4 is formed at the boundary portion of each pixel (dot of the transparent ITO electrode 3) so as to partition each pixel, a composition (ink composition) 5 ejected from a nozzle is supplied and adheres to the top of the transparent ITO electrode partitioned by banks 4. By using luminescent materials of three colors in the compositions, a multicolored luminescent display can be produced.

First, as compositions (ink compositions) three compositions were prepared by mixing luminescent materials with solvents in the prescriptions shown in Table 1 hereinbelow. The luminescent materials are selected from among compounds 1 through 5, which are characterized by the present invention described hereinabove, and furthermore, compound 6 is utilized as needed.

Next, using an ink jet apparatus, these compositions were ejected onto a substrate (TFT substrate), which had banks 4 consisting of a polyimide, and for which a TFT was provided for each pixel. The size of an area subjected to ejecting (area partitioned by banks 4) was 30 μm×30 μm, the pitch was 70 μm, and the pitch of the ejecting of the compositions (ink compositions) was set at 70 μm. Dispensing was satisfactorily performed without any clogging occurring in the ink jet heads, making it possible to obtain a substrate on which three inks were arranged in a mosaic shape.

TABLE 1

|  | Luminescent Materials | Solvents |
| --- | --- | --- |
| R (Red) ink | Compound 1 0.70 g | Dodecylbenzene |
|  | Compound 2 0.2 g | 100 ml |
|  | Compound 6 0.1 g | Tetralin 100 ml |
| G (Green) ink | Compound 1 0.76 g | Dodecylbenzene |
|  | Compound 2 0.2 g | 100 ml |
|  | Compound 4 0.04 g | Tetralin 100 ml |
| B (Blue) ink | Compound 1 0.78 g | Dodecylbenzene |
|  | Compound 2 0.15 g | 100 ml |
|  | Compound 3 0.07 g | Tetralin 100 ml |

A luminescent layer was achieved by subjecting this substrate to heat treatment on a hot plate at 100° C. in a nitrogen environment. The film thickness of the produced luminescent layer or emitting layer was 0.08–0.1 μm. In addition, lithium fluoride (100 nm), calcium (100 nm) and aluminum (150 nm) were deposited in that order on the luminescent layer, the resulting laminate structure was sealed in epoxy resin, and an organic EL display device was achieved.

Upon driving the TFT device provided on each transparent ITO electrode (dot) at 10 volts, it was possible to display a desired color in a pixel (a color equivalent to the luminescent layer provided on this pixel). Further, motion pictures could also be displayed. In particular, in a pixel in which G ink had been ejected, the peak ratio of 440 nm and 530 nm of the luminous wavelength spectrum (440 nm/530 nm) measured 1.0, and visually the green was displayed well.

Example 2-2

Three compositions (ink compositions) were prepared by mixing luminescent materials with solvents in the compositions shown in Table 2 hereinbelow and, in the same way as Example 2-1, using an ink jet apparatus, these compositions were ejected onto a substrate (TFT substrate) having banks 4 consisting of polyimide as shown in FIG. 1. The size of an area subjected to ejecting (area partitioned by banks 4) was 30 μm×30 μm, the pitch was 70 μm, and the pitch of the ejecting of the compositions (ink compositions) was set at 70 μm. Dispensing was satisfactorily performed without any clogging occurring in the ink jet heads, making it possible to obtain a substrate on which three inks were arranged in a mosaic shape.

TABLE 2

|  | Luminescent Materials | Solvents |
| --- | --- | --- |
| R (Red) ink | Compound 1 0.70 g | Dodecylbenzene |
|  | Compound 2 0.2 g | 100 ml |
|  | Compound 5 0.1 g | Tetralin 100 ml |
| G (Green) ink | Compound 1 0.76 g | Dodecylbenzene |
|  | Compound 2 0.2 g | 100 ml |
|  | Compound 4 0.04 g | Tetralin 100 ml |
| B (Blue) ink | Compound 1 0.78 g | Dodecylbenzene |
|  | Compound 2 0.15 g | 100 ml |
|  | Compound 3 0.07 g | Tetralin 100 ml |

A luminescent layer was achieved by subjecting this substrate to heat treatment on a hot plate at 100° C. in a nitrogen environment. The film thickness of the produced luminescent layer was 0.08–0.1 μm. In addition, lithium fluoride (100 nm), calcium (100 nm) and aluminum (150 nm) were deposited in that order on the luminescent layer, the resulting laminate structure was sealed in epoxy resin, and an organic EL display device was achieved.

Upon driving the TFT devices provided on each transparent ITO electrode (dot) at 10 volts, it was possible to display a desired color in a pixel (a color equivalent to the luminescent layer provided on this pixel). Further, motion pictures could also be displayed. In particular, in a pixel in which G ink had been ejected, the peak ratio of 440 nm and 530 nm of the luminous wavelength spectrum (440 nm/530 nm) measured 1.0, and the green was displayed well visually.

Example 2-3

The same as in Example 2-1, first three compositions (ink compositions) of the compositions shown in Table 1 above were prepared, and using an ink jet apparatus, these inks were ejected onto a TFT substrate having banks 4 consisting of polyimide as shown in FIG. 1. Dispensing was satisfactorily performed without any clogging occurring in the ink jet heads.

A luminescent layer was achieved by subjecting this substrate to heat treatment on a hot plate for 1 minute at 100°

C. in a nitrogen environment, immediately reducing pressure (1 mmHg mercury column), and removing the solvent. The film thickness of the resulting luminescent layer was 0.08–0.1 μm. In addition, lithium fluoride (100 nm), calcium (100 nm) and aluminum (150 nm) were deposited in that order on the luminescent layer. The resulting laminate structure was sealed in epoxy resin, and an organic EL display device was achieved.

Upon driving the TFT devices provided on each transparent ITO electrode (dot) at 10 volts, it was possible to display a desired color in a pixel (a color equivalent to the luminescent layer provided on this pixel). Further, motion pictures could also be displayed. In particular, in a pixel in which G ink had been ejected, the peak ratio of 440 nm and 530 nm of the luminous wavelength spectrum (440 nm/530 mm) measured 1.8, and the green color display was even better.

Example 2-4

The same as in Example 1, first three compositions (ink compositions) of the compositions shown in Table 1 above were prepared, and using an ink jet apparatus, these inks were ejected onto a TFT substrate having banks 4 consisting of polyimide as shown in FIG. 1. Dispensing was satisfactorily performed without any clogging occurring in the ink jet heads.

A luminescent layer was achieved by subjecting this substrate to heat treatment on a hot plate for 1 minute at 150° C. in a 2-atmosphere nitrogen environment, immediately reducing pressure (1 mmHg mercury column), and removing the solvent. The film thickness of the resulting luminescent layer was 0.08–0.1 μm. In addition, lithium fluoride (100 nm), calcium (100 nm) and aluminum (150 nm) were deposited in that order on the luminescent layer. The resulting laminate structure was sealed in epoxy resin, and an organic EL display device was achieved.

Upon driving the TFT devices provided on each transparent ITO electrode (dot) at 10 volts, it was possible to display a desired color in a pixel (a color equivalent to the luminescent layer provided on this pixel). Further, motion pictures could also be displayed. In particular, in a pixel in which G ink had been ejected, the peak ratio of 440 nm and 530 nm of the luminous wavelength spectrum (440 nm/530 nm) measured 2.0, and green was displayed even better.

Example 2-5

Three compositions (ink compositions) were prepared by mixing 100 ml of cyclohexylbenzene in place of tetralin in the compositions shown in Table 2-2 above, with the other luminescent materials being the same, and mixing these luminescent materials with a solvent, and the same as in Example 2-1, using an ink jet apparatus, and ejecting these inks onto a TFT substrate having banks 4 consisting of polyimide as shown in FIG. 1. Ejecting was performed at a pitch of 70 μm and a substrate on which three inks were arranged in a mosaic shape was obtained.

This substrate was subjected to heat treatment on a hot plate at 130° C. in a nitrogen environment. The film thickness of the resulting luminescent layer was 0.08–0.1 m. In addition, lithium fluoride (100 nm), calcium (100 nm) and aluminum (150 nm) were deposited in that order on the luminescent layer.

Upon driving the TFT devices provided on each transparent ITO electrode (dot) at 10 volts, it was possible to display a desired color in a pixel (a color equivalent to the luminescent layer provided on this pixel). Further, motion pictures could also be displayed.

Example 2-6

Three compositions (ink compositions) were prepared using the same compositions as in Example 2-5, and the same as in this example, these inks were ejected using an ink jet apparatus onto a TFT substrate having banks 4 consisting of polyimide as shown in FIG. 1.

Immediately after subjecting this substrate to heat treatment on a hot plate for 1 minute at 180° C. in a 2-atmosphere nitrogen environment, pressure was reduced (1 mmHg), the solvent was removed, and a luminescent material layer was achieved. The film thickness of the resulting luminescent layer was 0.08–0.1 μm. In addition, lithium fluoride (100 nm), calcium (100 nm) and aluminum (150 nm) were deposited in that order on the luminescent layer. The resulting laminate structure was sealed in epoxy resin, and an organic EL display device was achieved.

Upon driving the TFT devices provided on each transparent ITO electrode (dot) at 10 volts, it was possible to display a desired color in a pixel (a color equivalent to the luminescent layer provided on this pixel). Further, motion pictures could also be displayed.

Comparative Example 2-1

A composition (R (Red) ink composition) was prepared by mixing luminescent materials with a solvent using the composition shown in Table 3 hereinbelow, and the same as in Example 2-1, an attempt was made to eject this ink using an ink jet apparatus onto a substrate (TFT substrate) having banks 4 consisting of polyimide as shown in FIG. 1. However, clogging occurred in the ink jet heads, making it impossible to form a luminescent layer on the substrate.

TABLE 3

|  | Luminescent Materials | Solvents |
| --- | --- | --- |
| R (Red) ink | Compound 7 0.98 g<br>Compound 8 0.02 g | Xylene 200 ml |

Furthermore, compounds 7 & 8, which were the luminescent materials used in this example, are compounds having the below structures.

COMPOUND 7

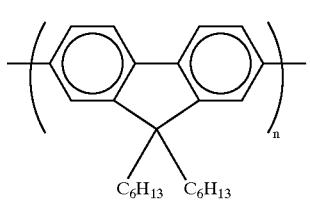

COMPOUND 8

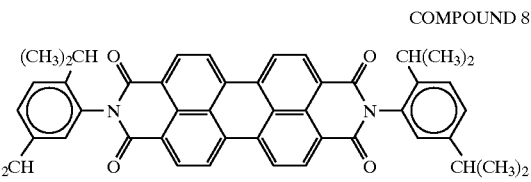

EXAMPLES OF THIRD EMBODIMENT

Example 3-1

First, as compositions, compositions 1–6 (three R (red), G (green) and B (blue) for each composition) were prepared by mixing polymer compounds as functional materials (luminescent materials) with solvents using the prescriptions shown in Tables 4–9 hereinbelow. As the polymer compounds, compounds were selected from compound 1–compound 5, which are functional materials that are particularly compatible with the third embodiment, and used.

TABLE 4

(Composition 1)

| | Polymer Compounds (1% wt/v) | | | Solvent |
|---|---|---|---|---|
| R (Red) | Compound 1 0.7 g | Compound 2 0.2 g | Compound 5 0.1 g | Xylene 100 ml |
| G (Green) | Compound 1 0.76 g | Compound 2 0.20 g | Compound 4 0.04 g | Xylene 100 ml |
| B (Blue) | Compound 1 0.78 g | Compound 2 0.15 g | Compound 3 0.07 g | Xylene 100 ml |

TABLE 5

(Composition 2)

| | Polymer Compounds (1% wt/v) | | | Solvent |
|---|---|---|---|---|
| R (Red) | Compound 1 0.7 g | Compound 2 0.2 g | Compound 5 0.1 g | Mesitylene 100 ml |
| G (Green) | Compound 1 0.76 g | Compound 2 0.20 g | Compound 4 0.04 g | Mesitylene 100 ml |
| B (Blue) | Compound 1 0.78 g | Compound 2 0.15 g | Compound 3 0.07 g | Mesitylene 100 ml |

TABLE 6

(Composition 3)

| | Polymer Compounds (1% wt/v) | | | Solvent |
|---|---|---|---|---|
| R (Red) | Compound 1 0.7 g | Compound 2 0.2 g | Compound 5 0.1 g | 1,2,3,4-tetramethyl-benzene 100 ml |
| G (Green) | Compound 1 0.76 g | Compound 2 0.20 g | Compound 4 0.04 g | 1,2,3,4-tetramethyl-benzene 100 ml |
| B (Blue) | Compound 1 0.78 g | Compound 2 0.15 g | Compound 3 0.07 g | 1,2,3,4-tetramethyl-benzene 100 ml |

TABLE 7

(Composition 4)

| | Polymer Compounds (1% wt/v) | | | Solvent | |
|---|---|---|---|---|---|
| R (Red) | Compound 1 0.7 g | Compound 2 0.2 g | Compound 5 0.1 g | Diethyl benzene 30 ml | 1,2,3,4-tetra-methyl-benzene 70 ml |
| G (Green) | Compound 1 0.76 g | Compound 2 0.20 g | Compound 4 0.04 g | Diethyl benzene 30 ml | 1,2,3,4-tetra-methyl-benzene 70 ml |

TABLE 7-continued (Composition 4)

| | Polymer Compounds (1% wt/v) | | | Solvent | |
|---|---|---|---|---|---|
| B (Blue) | Compound 1 0.78 g | Compound 2 0.15 g | Compound 3 0.07 g | Diethyl benzene 30 ml | 1,2,3,4-tetra-methyl-benzene 70 ml |

TABLE 8

(Composition 5)

| | Polymer Compounds (1% wt/v) | | | Solvent | |
|---|---|---|---|---|---|
| R (Red) | Compound 1 0.7 g | Compound 2 0.2 g | Compound 5 0.1 g | Mesitylene 80 ml | Cyclo-hexyl-benzene 20 ml |
| G (Green) | Compound 1 0.76 g | Compound 2 0.20 g | Compound 4 0.04 g | Mesitylene 80 ml | Cyclo-hexyl-benzene 20 ml |
| B (Blue) | Compound 1 0.78 g | Compound 2 0.15 g | Compound 3 0.07 g | Mesitylene 80 ml | Cyclo-hexyl-benzene 20 ml |

TABLE 9

(Composition 6)

| | Polymer Compounds (1% wt/v) | | | Solvent | |
|---|---|---|---|---|---|
| R (Red) | Compound 1 0.7 g | Compound 2 0.2 g | Compound 5 0.1 g | Dodecyl benzene 30 ml | 1,2,3,4-tetra-methyl-benzene 70 ml |
| G (Green) | Compound 1 0.76 g | Compound 2 0.20 g | Compound 4 0.04 g | Dodecyl benzene 30 ml | 1,2,3,4-tetra-methyl-benzene 70 ml |
| B (Blue) | Compound 1 0.78 g | Compound 2 0.15 g | Compound 3 0.07 g | Dodecyl benzene 30 ml | 1,2,3,4-tetra-methyl-benzene 70 ml |

Furthermore, the vapor pressure (room temperature) of the solvents utilized in compositions 1–6 are as shown below.
Xylene: 13.80
Mesitylene: 1.73
1,2,3,4-tetramethylbenzene: 0.23
Diethylbenzene: 0.70
Cyclohexylbenzene: 0.193
Dodecylbenzene: 0.0000125.

Assessments of solution stability, properties of ejecting, and phase separation, respectively, for the above-mentioned compositions were carried out in accordance with the assessment criteria hereinbelow. The results of these assessments are shown in Table 10.

Solution stability: Assessed by determining whether or not precipitation was evident (whether or not there was a change in turbidity) when a composition was left standing at room temperature for more than two days from time of preparation. Furthermore, turbidity changes were evident at 650 nm for G, B compositions, and turbidity changes were evident at 700 nm for R compositions.

○: No turbidity change (Transparent solution)

X: Change in turbidity (Precipitation occurred).

Properties of ejecting: The flights of composition (ink) droplets from a piezoelectric drive ink jet head (Epson MJ-930C) were observed.

⊚ : Extremely good

○: Good (Slight curvature of flight, but patterning can be performed)

X: Flight curves and nozzle clogging occurs.

Phase separation: Assessed using either the photoluminescence (PL) or EL luminescence spectrum of a naturally dried film after patterning in each of the R, G, B colors.

○: Compound 1 original short wavelength spectrum not observed

X: Compound 1 original short wavelength spectrum observed

TABLE 10

|  | Composition | Solution Stability | Properties of ejecting | Phase Separation |
|---|---|---|---|---|
| Comparative Product | 1 (R,G,B) | ○ | x | — |
| Present Invention Product | 2 (R,G,B) | ○ | ○ | ○ |
|  | 3 (R,G,B) | ○ | ⊚ | ○ |
|  | 4 (R,G,B) | ○ | ⊚ | ○ |
|  | 5 (R,G,B) | ○ | ⊚ | ○ |
|  | 6 (R,G,B) | ○ | ⊚ | x |

However, for composition 6, using the same conditions as in Example 2-1 through 2-6, phase separation became "○" in accordance with either heat treatment or heat treatment under applying pressure following dispensing.

Example 3-2

Substrate Formation

Figure 2:
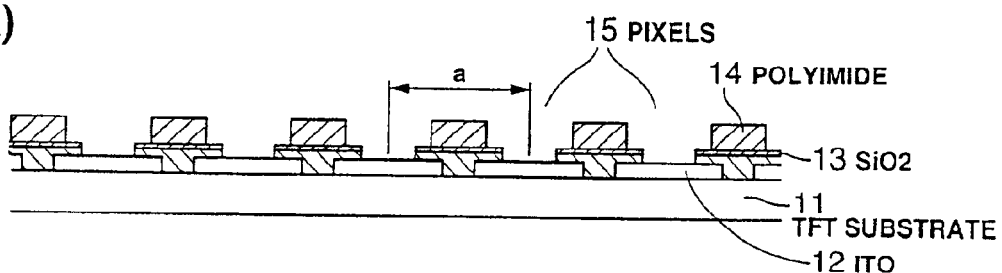
FIG. 2 is a simplified cross-sectional view schematically showing a portion of the manufacturing processes of an organic EL device as a functional device using a composition of the present invention (substrate formation process—hole injection/transport layer formation process)
Figure 2:
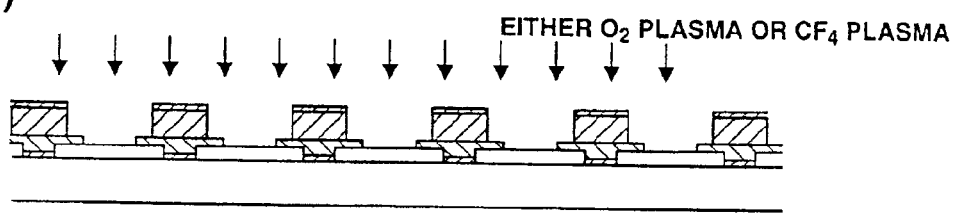
Figure 2:
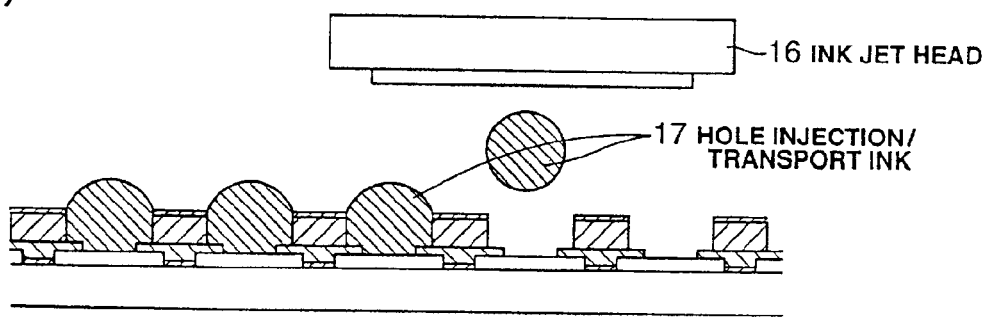
Figure 2:
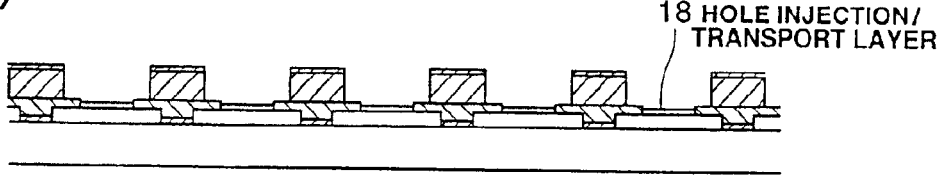

A substrate having pixels, which are shown in FIG. 2(A) was formed as explained hereinbelow. On a TFT substrate 11, ITO 12, $SiO_2$ 13 and polyimide 14 were formed into a pattern using a photolithography method. This $SiO_2$ and polyimide are portions constituting banks. At this time, by providing a circular opening portion of 28 μmφ in the $SiO_2$, and also providing a circular opening portion of 32 μmφ in the polyimide on top thereof, circular pixels 15 comprising these two opening portions were formed. The pitch a of these pixels is 70.5 μm. The above-mentioned pixels, which are partitioned by $SiO_2$ and polyimide, constitute the portions to which a dispensing composition containing the below-described organic EL material are applied for performing patterning using an ink jet system.

Plasma Processing of Substrate

Next, $O_2$ and $CF_4$ continuous atmospheric pressure plasma processes were carried out in the direction of the arrows of FIG. 2(B) on the above-mentioned substrate in which circular pixels had been formed. The conditions of these plasma processes were as follows. That is, under atmospheric pressure, the power was set to 300 W, and the distance between the electrode and the substrate was set at 1 mm. Further, for the $O_2$ plasma, the $O_2$ gas flow was 80 ccm, the helium gas flow was 10 l/min, and the table conveyance rate was set at 10 mm/s, and for the $CF_4$ plasma, the $CF_4$ gas flow was 100 ccm, the helium gas flow was 10 l/min, and the table conveyance rate was set at 5 mm/s.

Hole Injection/Transport Layer Formation Using Ink Jet System

Compositions consisting of the compositions shown in Table 11 were prepared as ink compositions for a hole injection/transport layer.

TABLE 11

| Material | Content (wt %) |
|---|---|
| Polyethylene dioxythiophene/polystyrene sulfonic acid mixture | 11.08 |
| Polystyrene sulfonic acid | 1.44 |
| Isopropyl alcohol | 10 |
| N-methylpyrolidone | 27.46 |
| 1,3-dimethyl-2-imidazolidinone | 50 |

As shown in FIG. 2(C), the ink composition 17 for the above-mentioned hole injection/transport layer was ejected at 20 pl from an ink jet head (Epson MJ-930C head) 16, and patterning was performed on each pixel electrode. After patterning, the solvent was removed under conditions of room temperature for 20 minutes in a vacuum (1 Torr), and thereafter, a hole injection/transport layer 18 was formed out-of-vacuum via heat treatment for 10 minutes at 200° C. (on a hot plate) (Refer to FIG. 2(D)). The film thickness of the resulting hole injection/transport layer 18 was 40 nm.

Formation of Luminescent Layer Using Ink Jet System

Figure 3:
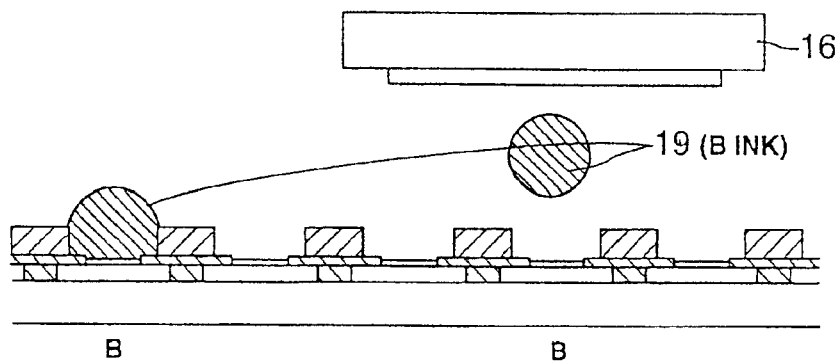
FIG. 3 is a simplified cross-sectional view schematically showing a portion of the manufacturing processes of an organic EL device as a functional device using a composition of the present invention (luminescent layer formation process—sealing process).
Figure 3:
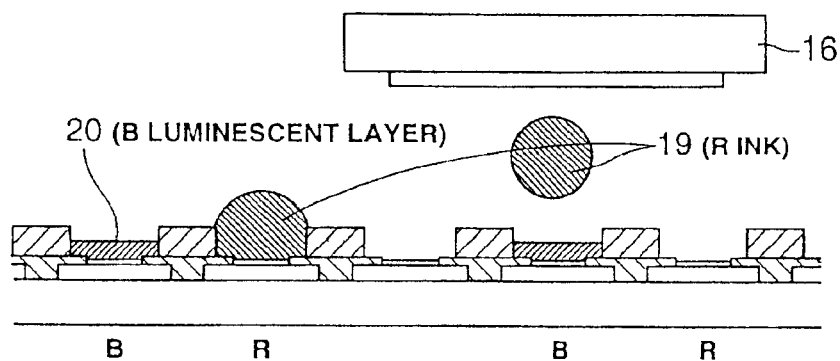
Figure 3:
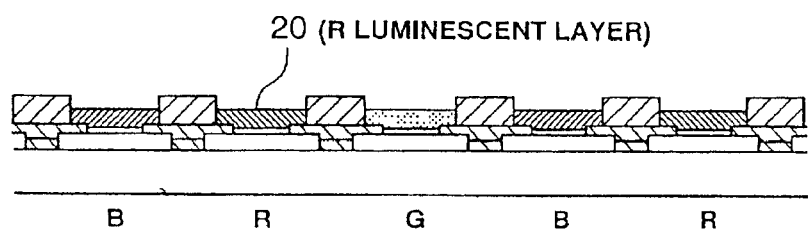
Figure 3:
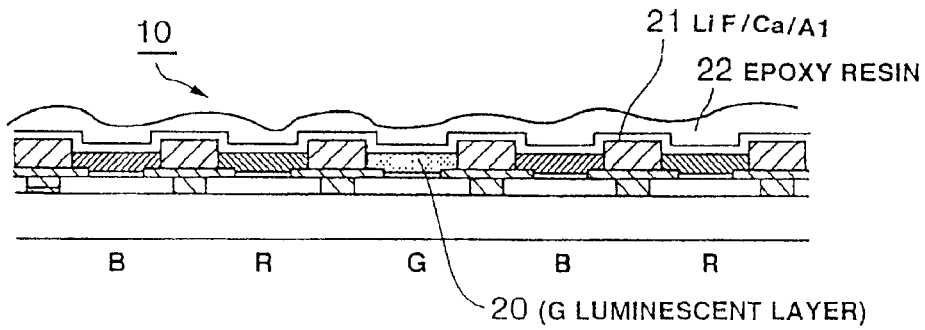

As shown in FIG. 3(E) and (F), in accordance with dispensing composition 2 of Table 5, which was utilized in the above-mentioned Example 3-1, from an ink jet head (Epson MJ-930C) 16 at 20 pl as the composition 19 for a luminescent layer, and performing patterning on each pixel electrode in B, R, G order, a luminescent layer 20 of each color was formed (Refer to FIG. 3(G)). After forming the luminescent layers 20, post baking was performed at 60° C. for 30 minutes under reduced pressure of less than 1 Torr.

Electrode/Sealing Processes

After forming the luminescent layers, an electrode (negative electrode) 21 was formed by depositing lithium fluoride (thickness: 2 nm), calcium (thickness: 20 nm), and aluminum (thickness: 20 nm). Finally, the above-mentioned electrode was sealed with an epoxy resin 22, and a color organic EL panel 10 was produced (Refer to FIG. 3(H)).

Example 3-3

Besides forming luminescent layers of each color by using composition 3 of Table 6, which was utilized in the above-mentioned Example 3-1, a color organic EL panel was produced using the same processes as in the above-mentioned Example 3-2.

Example 3-4

Besides forming luminescent layers of each color by using composition 4 of Table 7, which was utilized in the above-mentioned Example 3-1, a color organic EL panel was produced using the same processes as in the above-mentioned Example 3-2.

Example 3-5

Besides forming luminescent layers of each color by using composition 5 of Table 8, which was utilized in the above-mentioned Example 3-1, a color organic EL panel was produced using the same processes as in the above-mentioned Example 3-2.

INDUSTRIAL APPLICABILITY

As explained hereinabove, a composition of the present invention can be used in an ink jet printing method instead of a photolithography method, which is the conventional functional material patterning method, can use, as a functional material, either a non-polar or a weakly polar material, or a material that is reactive with water, and can prevent clogging at dispensing time, achieve stable dispensing, and prevent precipitation of content matter during dispensing and phase separation at film formation following dispensing.

Further, a functional film of the present invention is a uniform, homogenous, micro film, which is formed using the above-mentioned composition. Further, a display device of the present invention is an outstanding display device such as an organic EL device, which is comprised by providing a luminescent material layer formed using the above-mentioned composition, and which is especially useful in luminous display applications.

Further, according to the manufacturing method of the display device of the present invention, it is possible to easily achieve an array of films having different functions. Further, because a required amount of material is used in a required part, it is possible to use less material than in methods according to spin coating methods.

What is claimed is:

1. A composition characterized in that said composition comprises an organic electroluminescent (EL) material and a solvent comprising at least one benzene derivative having 1 or more substituents, and these substituents having 3 or more carbon atoms in total,
    wherein the boiling point of said benzene derivative is 200° C. or higher.

2. The composition according to claim 1, wherein said benzene derivative is dodecylbenzene.

3. A composition characterized in that said composition comprises an organic electroluminescent (EL) material and a solvent comprising at least one benzene derivative having 1 or more substituents, and these substituents having 3 or more carbon atoms in total,
    wherein said solvent, which comprises at least one benzene derivative, contains another solvent of boiling point 140° C. or higher.

4. The composition according to claim 3, wherein said benzene derivative is dodecylbenzene, and said other solvent of boiling point 140° C. or higher is at least one selected from the group consisting of cymene, tetralin, cumenem, declain, durene, cyclohexylbenzene, dihexylbenzene, tetramethylbenzene and dibutylbenzene.

5. A composition characterized in that said composition comprises an organic electroluminescent (EL) material and a solvent comprising at least one benzene derivative having 1 or more substituents, and these substituents having 3 or more carbon atoms in total,
    wherein said solvent, which comprises at least one benzene derivative, contains another solvent of boiling point 180° C. or higher.

6. A composition characterized in that said composition comprises an organic electroluminescent (EL) material and a solvent comprising at least one benzene derivative having 1 or more substituents, and these substituents having 3 or more carbon atoms in total,
    wherein a vapor pressure (at room temperature) of said benzene derivative is 0.10–10 mmHg, and
    said benzene derivative is 1,2,3,4-tetramethylbenzene.

7. A composition characterized in that said composition comprises an organic electroluminescent (EL) material and a solvent comprising at least one benzene derivative having 1 or more substituents, and these substituents having 3 or more carbon atoms in total,
    wherein a vapor pressure (at room temperature) of said benzene derivative is 0.10–10 mmHg, and
    said benzene derivative is a mixture of at least one benzene derivative of vapor pressure 0.10–0.50 mmHg, and at least one benzene derivative of vapor pressure 0.50–10 mmHg.

8. The composition according to claim 7 wherein said benzene derivative of vapor pressure 0.10–0.50 mmHg is tetramethylbenzene.

9. The composition according to claim 7 wherein said benzene derivative of vapor pressure 0.10–0.50 mmHg is cyclohexylbenzene.

10. The composition according to claim 7 wherein said benzene derivative of vapor pressure 0.50–10 mmHg is diethyl benzene and/or mesitylene.

11. A composition characterized in that said composition comprises an organic electroluminescent (EL) material and a solvent comprising at least one benzene derivative having 1 or more substituents, and these substituents having 3 or more carbon atoms in total,
    wherein said organic EL material is at least one of fluorine derivative, and said fluorine derivative is a compound of compounds 1 through 4 herein below:

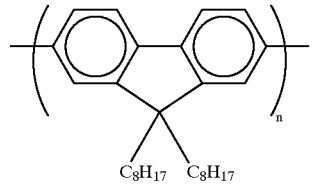

COMPOUND 1

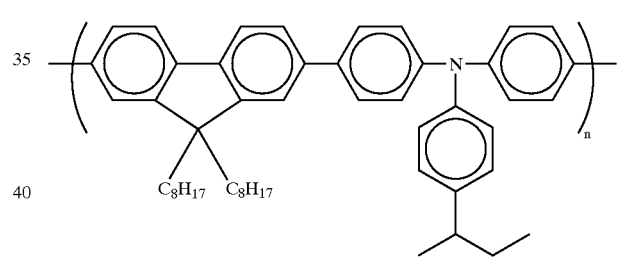

COMPOUND 2

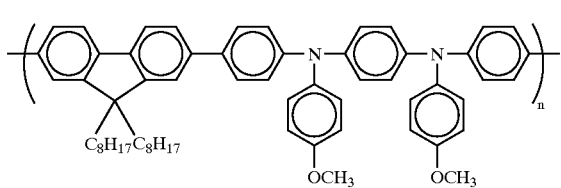

COMPOUND 3

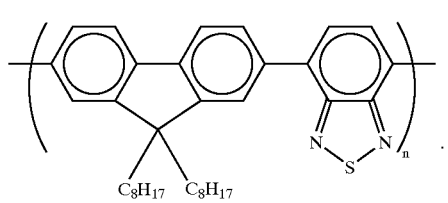

COMPOUND 4

* * * * *